United States Patent
Codilian (12)

(10) Patent No.: US 6,697,217 B1
(45) Date of Patent: Feb. 24, 2004

(54) DISK DRIVE COMPRISING A COATING BONDED TO A PRINTED CIRCUIT BOARD ASSEMBLY

(75) Inventor: Raffi Codilian, Irvine, CA (US)

(73) Assignee: Western Digital Technologies, Inc., Lake Forest, CA (US)

( * ) Notice: Subject to any disclaimer, the term of this patent is extended or adjusted under 35 U.S.C. 154(b) by 0 days.

(21) Appl. No.: 10/011,163

(22) Filed: Nov. 30, 2001

(51) Int. Cl.[7] .................................................. G11B 5/12
(52) U.S. Cl. ................................................... 360/97.01
(58) Field of Search ........... 369/263; 360/97.01–97.04; 427/96

(56) References Cited

U.S. PATENT DOCUMENTS

| | | | |
|---|---|---|---|
| 5,246,730 A | * | 9/1993 | Peirce et al. .................. 427/96 |
| 6,288,866 B1 | | 9/2001 | Butler et al. |
| 6,320,723 B1 | * | 11/2001 | Bernett ..................... 360/97.02 |
| 6,429,999 B1 | * | 8/2002 | Dague et al. ............ 360/97.01 |

* cited by examiner

*Primary Examiner*—Allen Cao
(74) *Attorney, Agent, or Firm*—Won Tae C. Kim, Esq.; Milad G. Shara, Esq.; Howard H. Sheerin, Esq.

(57) ABSTRACT

A disk drive is disclosed comprising a head disk assembly (HDA) including an enclosure for housing a disk and a head actuated radially over the disk. A printed circuit board assembly (PCBA) is attached to the HDA enclosure, wherein the PCBA comprises at least one attached electrical component. A non-electrically conductive coating is bonded to at least part of the PCBA after attaching the electrical component to the PCBA.

54 Claims, 10 Drawing Sheets

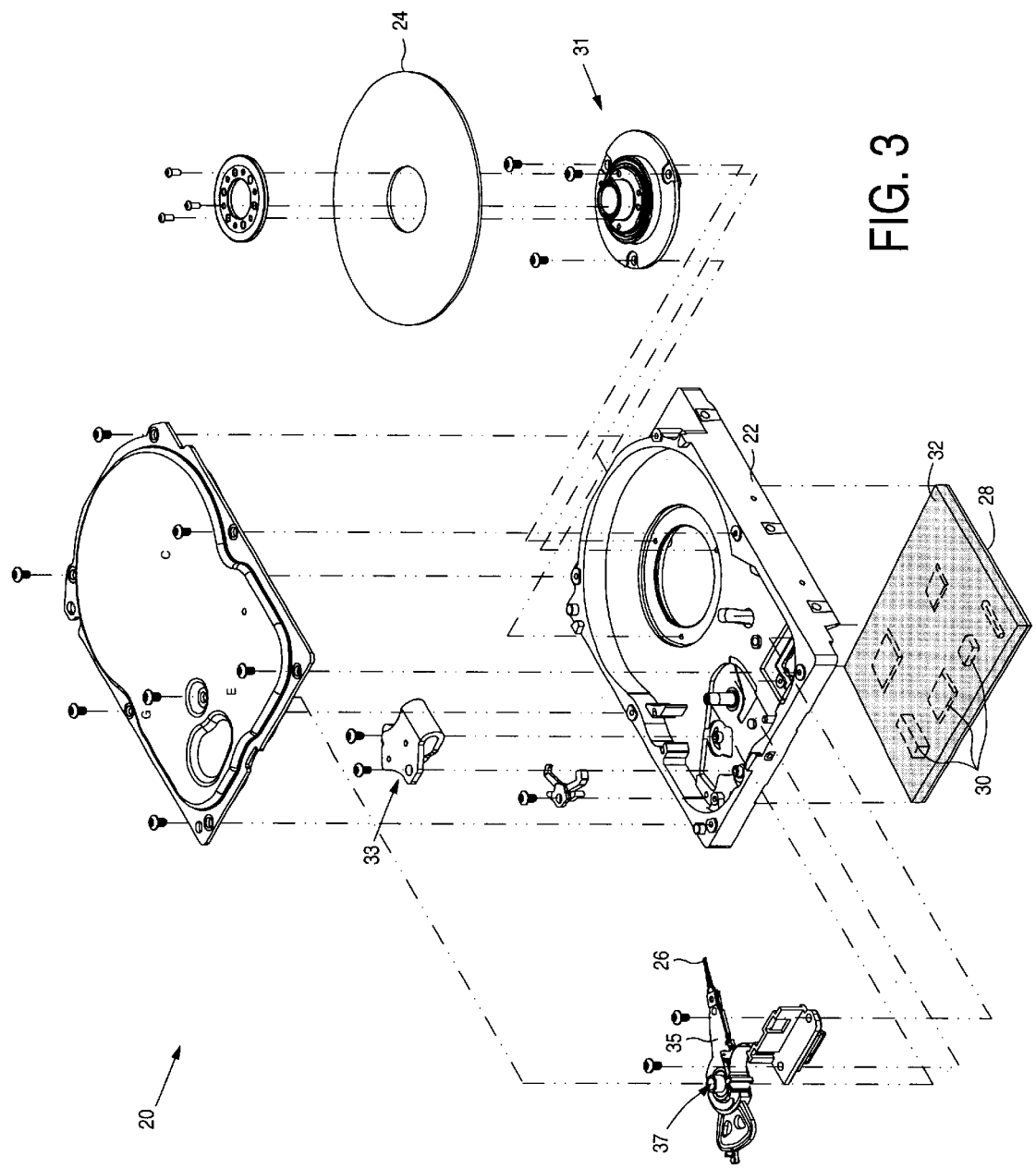

DISK DRIVE COMPRISING A COATING BONDED TO A PRINTED CIRCUIT BOARD ASSEMBLY

BACKGROUND OF THE INVENTION

1. Field of the Invention

The present invention relates to disk drives. More particularly, the present invention relates to a disk drive comprising a coating bonded to a printed circuit board assembly.

2. Description of the Prior Art

FIG. 1 shows an exploded view of a prior art disk drive 2 comprising a head disk assembly (HDA) enclosure 4 which houses a disk 6 and an actuator arm 8 for actuating a head 10 radially over the disk 6. The actuator arm 8 is rotated about a pivot 12 by a voice coil motor (VCM) 13, and the disk 4 is rotated about its axis by a spindle motor 14. A printed circuit board assembly (PCBA) 16 is attached to the HDA enclosure 4 using screws or adhesive. Electrical components 18 are typically mounted on a surface of the PCBA 16 facing the HDA enclosure 4, whereas the opposite surface of the PCBA is exposed to the environment. This is illustrated in FIG. 2A which shows a bottom view of the disk drive 2 of FIG. 1, including the exposed surface of the PCBA 16. FIG. 2B shows a side view of the disk drive of FIG. 1, including the PCBA 16 attached to the bottom of the HDA enclosure 4 inside a hollowed area for receiving the PCBA 16.

To protect the electrical leads on the exposed surface of the PCBA 16, the disk drive 2 is typically housed in some sort of enclosure, such as within a PC or an external disk drive housing made of metal or plastic. The disk drive's enclosure also protects against physical damage to the PCBA 16 and mounted electrical components 18 which is of particular concern in portable applications where the portable device may be dropped. However, if the disk drive's enclosure is subjected to a substantial physical shock, the shock may still propagate to the PCBA 16 and damage the electrical components 18 even if the enclosure is not actually compromised.

There is, therefore, a need to protect a disk drive against physical shocks which may damage the PCBA and mounted electrical components.

SUMMARY OF THE INVENTION

The present invention may be regarded as a disk drive comprising a head disk assembly (HDA) including an enclosure for housing a disk and a head actuated radially over the disk. A printed circuit board assembly (PCBA) is attached to the HDA enclosure, wherein the PCBA comprises at least one attached electrical component. A non-electrically conductive coating is bonded to at least part of the PCBA after attaching the electrical component to the PCBA.

In one embodiment, the coating is bonded to the PCBA by applying the coating in liquid form to the PCBA and then solidifying the coating. In one embodiment, the coating is liquefied through heating and solidified through cooling. In another embodiment, the coating is solidified through a chemical process. In yet another embodiment, the liquefied coating is sprayed onto the PCBA. In yet another embodiment, the PCBA is dipped into the liquefied coating.

In one embodiment, the coating comprises a heat dissipating material. In one embodiment the coating comprises a plastic material, and in one embodiment the coating comprises a polymer material.

In one embodiment, the PCBA forms at least one crevice with respect to the HDA enclosure, and the coating is disposed within at least part of the crevice. In one embodiment, the coating substantially covers the entire PCBA and the entire HDA enclosure.

In one embodiment, the coating is bonded to the PCBA before the PCBA is attached to the HDA enclosure. In an alternative embodiment, the coating is bonded to the PCBA after the PCBA is attached to the HDA enclosure.

The present invention may also be regarded as a method of manufacturing a disk drive. The method comprises the steps of inserting a disk and a head into an enclosure of a head disk assembly (HDA), attaching at least one electrical component to a printed circuit board assembly (PCBA), attaching the PCBA to the HDA enclosure, and bonding a non-electrically conductive coating to at least part of the PCBA after attaching the electrical component to the PCBA.

BRIEF DESCRIPTION OF THE DRAWINGS

FIG. 3 shows a disk drive according to an embodiment of the present invention wherein a coating is bonded to at least part of the PCBA after attaching at least one electrical component.

DESCRIPTION OF THE PREFERRED EMBODIMENTS

Figure 1:
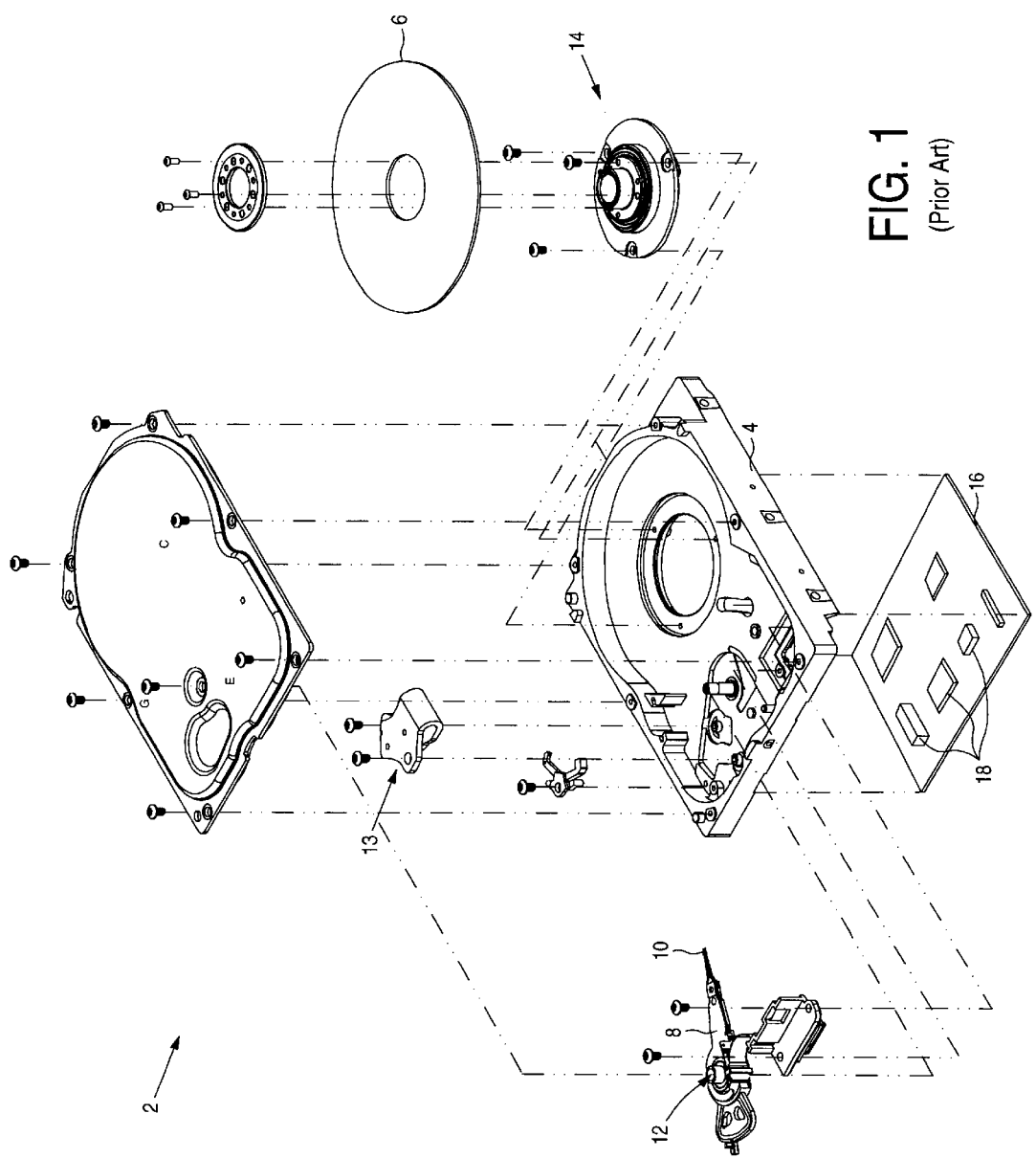
FIG. 1 shows a prior art disk drive comprising a PCBA attached to an HDA enclosure.
Figure 2A:
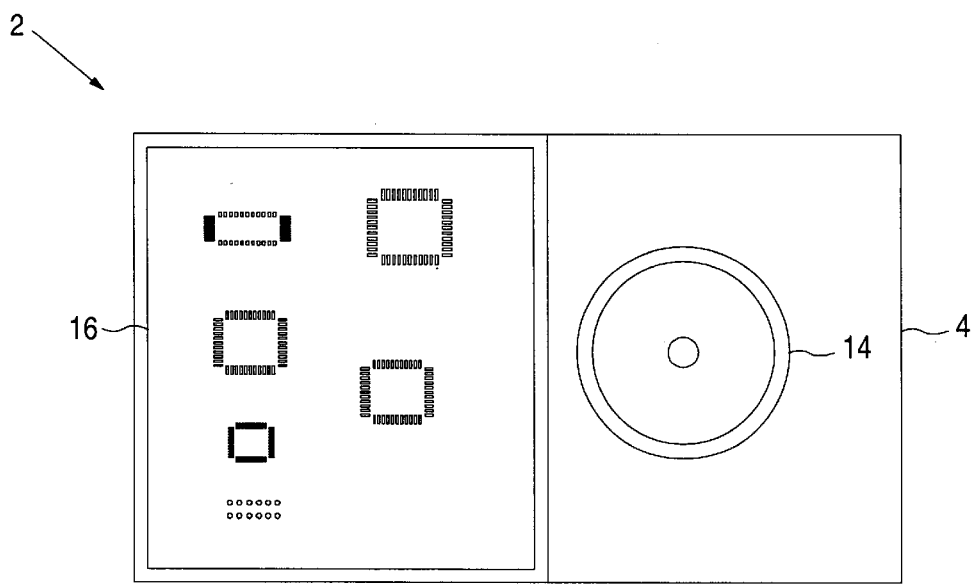
FIG. 2A shows a bottom view of the prior art disk drive of FIG. 1, including the electrical leads on the exposed surface of the PCBA.
Figure 2B:
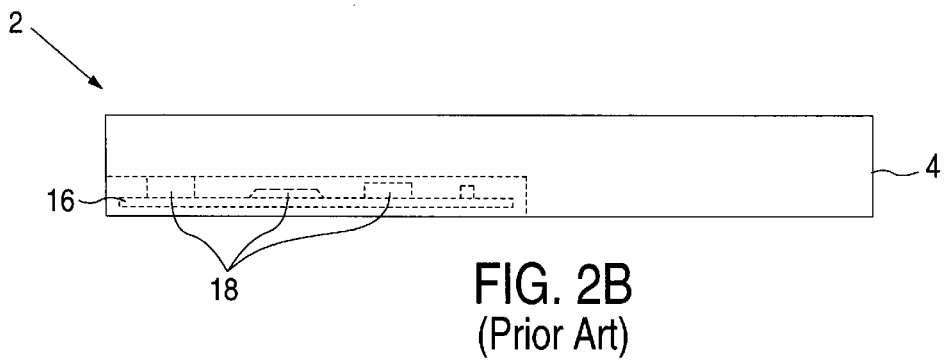
FIG. 2B shows a side view of the prior art disk drive of FIG. 1, including the PCBA attached to the HDA enclosure within a hollowed area for receiving the PCBA.

FIG. 3 shows a disk drive 20 according to an embodiment of the present invention comprising a head disk assembly (HDA) including an enclosure 22 for housing a disk 24 and a head 26 actuated radially over the disk 24. A printed circuit board assembly (PCBA) 28 is attached to the HDA enclosure 22, wherein the PCBA 28 comprises at least one attached electrical component 30. A non-electrically conductive coating 32 is bonded to at least part of the PCBA 28 after attaching the electrical component 30 to the PCBA 28.

In the embodiment of FIG. 3, a spindle motor 31 rotates the disk 24 about its axis, and a voice coil motor (VCM) 33 rotates an actuator arm 35 about a pivot 37 in order to actuate the head 26 radially over the disk 24.

In one embodiment, the coating 32 is bonded to the PCBA 28 by applying the coating 32 in liquid form to the PCBA 28 and solidifying the coating 32. In one embodiment, the coating 32 is liquefied through heating and solidified through cooling. In one embodiment, the coating 32 is solidified through a chemical process. In one embodiment, the liquefied coating 32 is sprayed onto the PCBA 28. In yet another embodiment, the PCBA 28 is dipped into the liquefied coating 32.

Figure 4A:
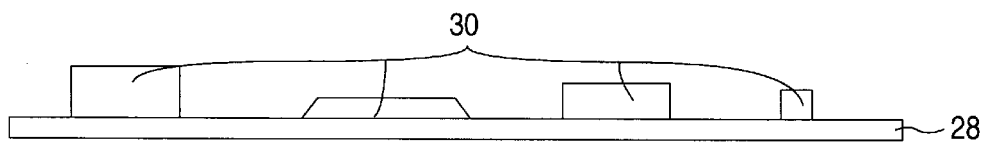
FIGS. 4A–4F illustrate various embodiments for bonding the coating to the PCBA.
Figure 4B:
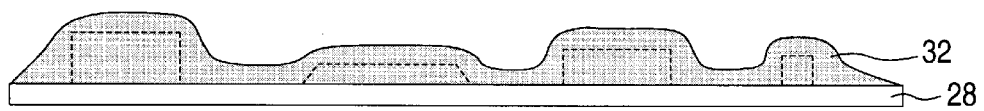
Figure 4C:
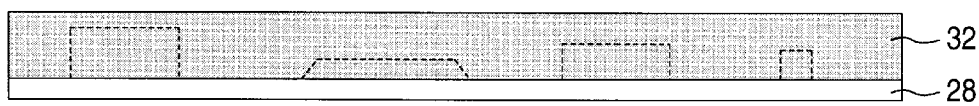
Figure 4D:
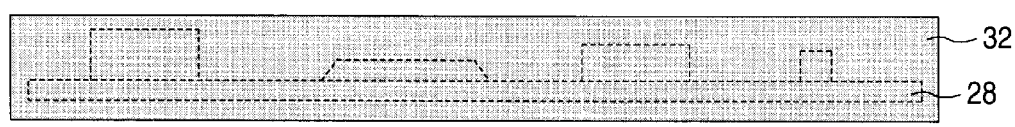
Figure 4E:
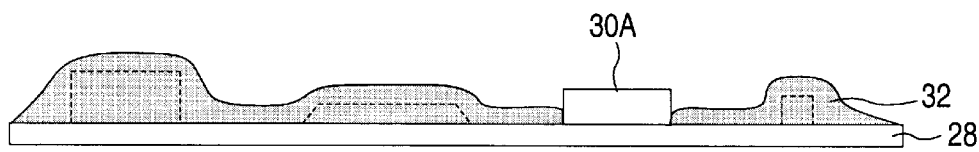
Figure 4F:
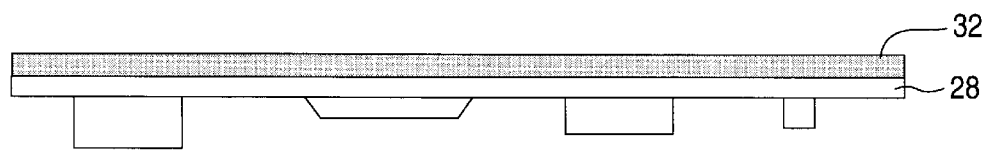

FIGS. 4A–4F illustrate various embodiments of the coating 32 bonded to the PCBA 28. FIG. 4A shows the PCBA 28 and attached electrical components 30 before applying the coating 32. FIG. 4B illustrates an embodiment wherein the coating 32 is bonded to the PCBA 28 in a liquid form so that the coating 32 flows over the electrical components 30 as well as the PCBA 28. FIG. 4C shows an embodiment wherein the PCBA 28 is placed in a mold and the coating 32 poured into the mold so as to form a smooth surface over the electrical components 30. In the embodiment of FIG. 4D, the PCBA 28 is substantially covered by the coating 32, for example by dipping the entire PCBA 28 in the coating 32 or pouring the coating 32 into a suitable mold. In this embodiment, a mask is used to cover the interface and power connecters of the PCBA 28 (not shown). The mask is then removed once the coating 32 has at least partially solidified so that the coating 32 does not cover the interface and power connectors. In the embodiment shown in FIG. 4E, a mask is placed over an electrical component 30A before applying the coating 32. Once the coating 32 at least partially solidifies, the mask is removed so that the coating 32 does not cover the electrical component 32A. Masking one or more electrical components from the coating 32 allows heat to dissipate from the components during normal operation of the disk drive. FIG. 4F shows an embodiment wherein the coating 32 is applied to the surface of the PCBA 28 opposite the surface that the electrical components 30 are mounted.

In one embodiment, the coating 32 comprises a plastic material, and in one embodiment the coating 32 is an injection molded plastic. In one embodiment, the coating 32 comprises a polymer material. In one embodiment, the coating 32 comprises a heat dissipating material which helps to cool the electrical components. The coating 32 is non-electrically conductive so that it can cover the electrical leads without adversely affecting the operation of the electrical components 30.

Figure 5A:
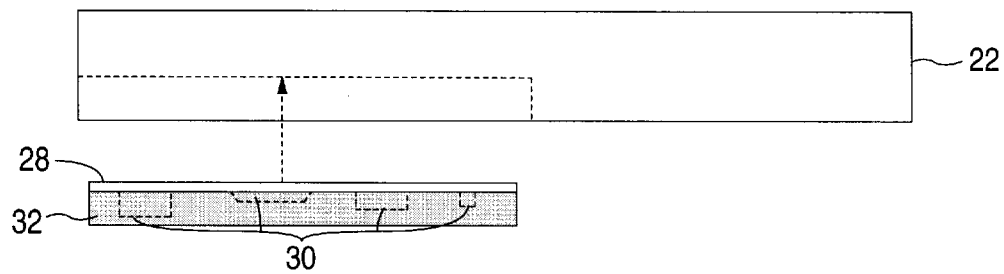
FIGS. 5A–5C illustrate an embodiment of the present invention wherein the coating is applied over at least one electrical component and the PCBA before attaching the PCBA to the HDA enclosure.
Figure 5B:
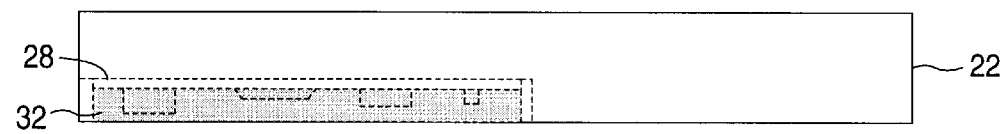
Figure 5C:
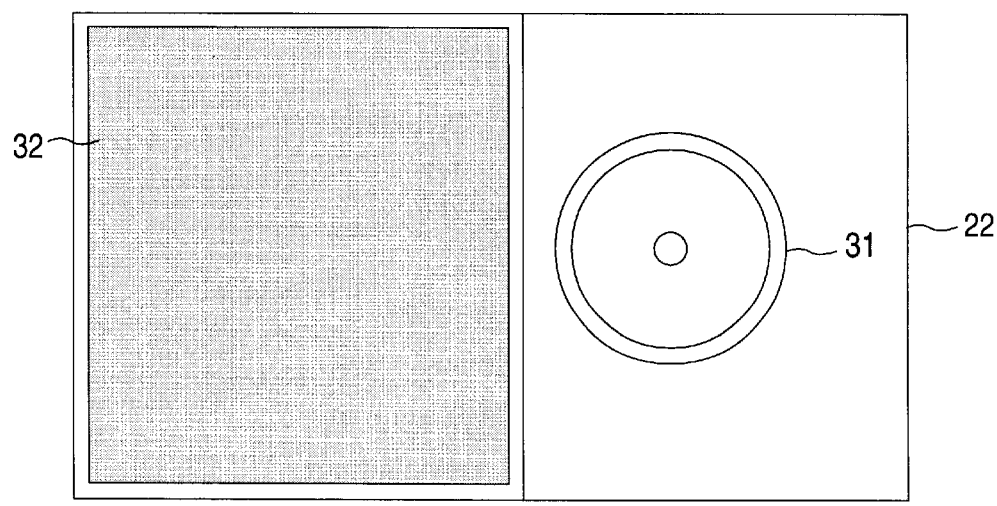

FIGS. 5A–5C illustrate a disk drive according to an embodiment of the present invention wherein the coating 32 is bonded to the PCBA 28 before attaching the PCBA 28 to the HDA enclosure 22. The coating 32 substantially covers the surface of the PCBA 28 that the electrical components 30 are mounted, wherein the opposite surface is attached to the HDA enclosure 22 within a hollowed area for receiving the PCBA 28 as shown in FIG. 5A and 5B. FIG. 5C shows a bottom view of the disk drive, wherein the PCBA 28 is substantially covered by the coating 32.

Figure 6A:
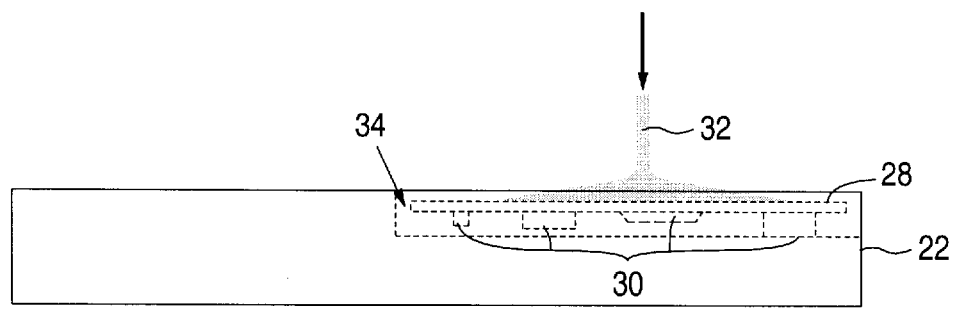
FIGS. 6A–6C illustrate an embodiment of the present invention wherein the coating is applied to an exposed surface of the PCBA, as well as within at least one crevice with respect to the HDA enclosure, after attaching the PCBA to the HDA enclosure.
Figure 6B:
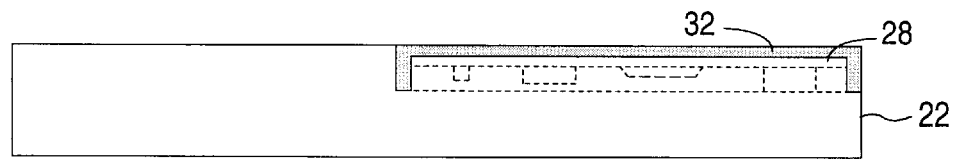
Figure 6C:
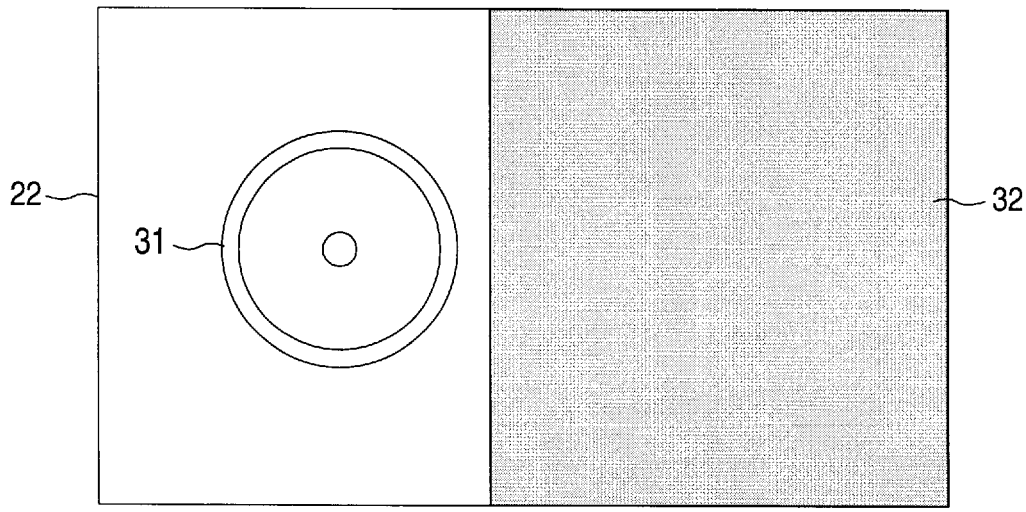

FIGS. 6A–6C illustrate a disk drive according to an embodiment of the present invention wherein the coating 32 is bonded to the PCBA 28 after attaching the PCBA 28 to the HDA enclosure 22. In this embodiment, the electrical components 30 are mounted on the surface of the PCBA 28 facing the HDA enclosure 22, and the coating 32 is applied to the surface of the PCBA 28 facing away from the HDA enclosure 22. In this embodiment, at least one crevice 34 is formed between the PCBA 28 and the HDA enclosure 22, and the coating 32 is disposed within at least part of the crevice 34 (FIG. 6B). In one embodiment, the coating 32 also covers an area of the HDA enclosure 22 forming the crevice 34 with the PCBA 28. FIG. 6C shows a bottom view of the disk drive wherein the coating 32 covers the entire PCBA 28 and fills in the crevices at the edges of the PCBA 28. In one embodiment, the coating 32 flows over the edge of the HDA enclosure 22 in order to strengthen the bond as well as buffer the otherwise sharp edges of the HDA enclosure 22 to further dampen the effects of a physical shock.

Figure 7A:
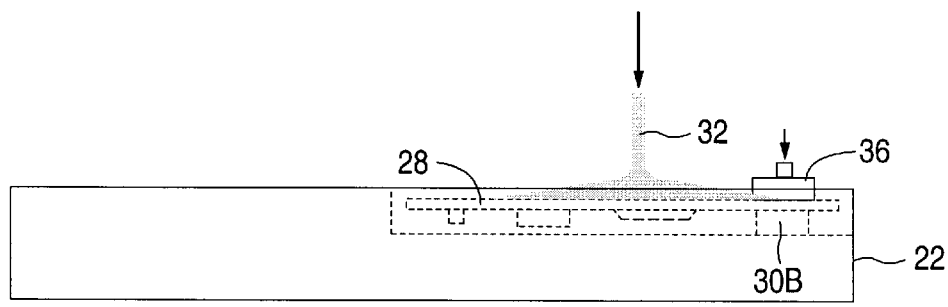
FIGS. 7A–7C illustrates an embodiment of the present invention wherein a mask is employed to prevent the coating from covering an area of the PCBA corresponding to at least one electrical component in order to facilitate heat dissipating from the electrical component.
Figure 7B:
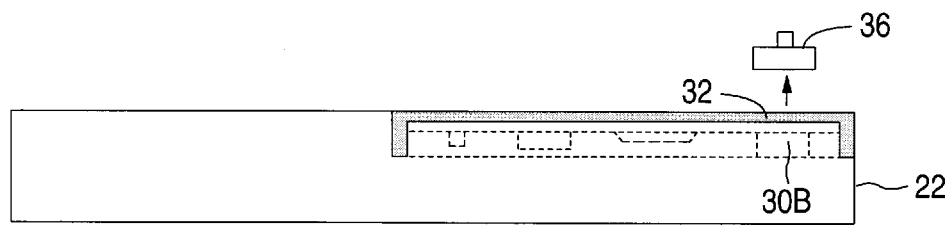
Figure 7C:
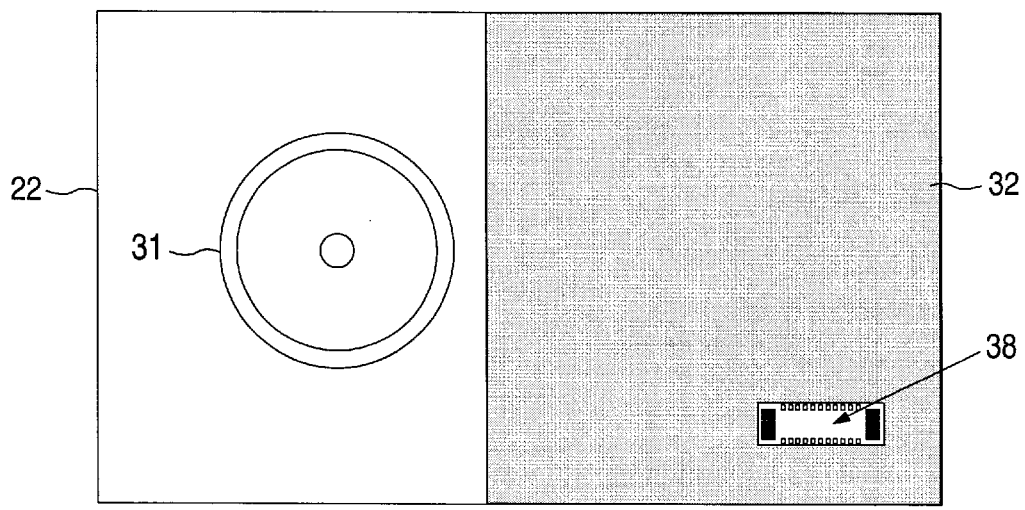

FIGS. 7A–7C illustrate a disk drive according to an embodiment of the present invention wherein a mask 36 is employed to prevent the coating 32 from covering an area of the PCBA 28 associated with an electrical component 30B. FIG. 7A shows that the mask 36 is applied to the PCBA 28 while applying the coating 32. Once the coating 32 at least partially solidifies, the mask 36 is removed as shown in FIG. 7B. As shown in FIG. 7C, the mask 36 prevents the coating 32 from covering the area 38 of the PCBA 28 associated with electrical component 30B which allows heat to dissipate from the electrical component 30B. The electrical component 30B may be a power driver circuit or other similar circuit which tends to generate more heat than other components. In the embodiment shown in FIGS. 7A–7C, the coating 32 is applied to the surface of the PCBA 28 opposite the electrical component 30B, and the mask 36 applied to the area 38 corresponding to the electrical component 30B. In an alternative embodiment, the coating 32 is applied to the surface of the PCBA 28 comprising the electrical component 30B, and the mask 36 is applied over the electrical component 30B (see FIG. 4E).

Figure 8A:
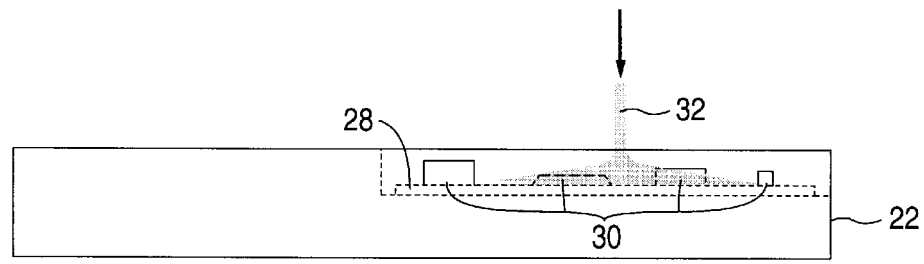
FIGS. 8A–8C illustrate an embodiment of the present invention wherein the coating is applied over at least one electrical component and the PCBA after attaching the PCBA to the HDA enclosure.
Figure 8B:
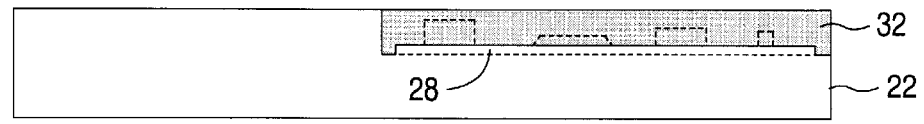
Figure 8C:
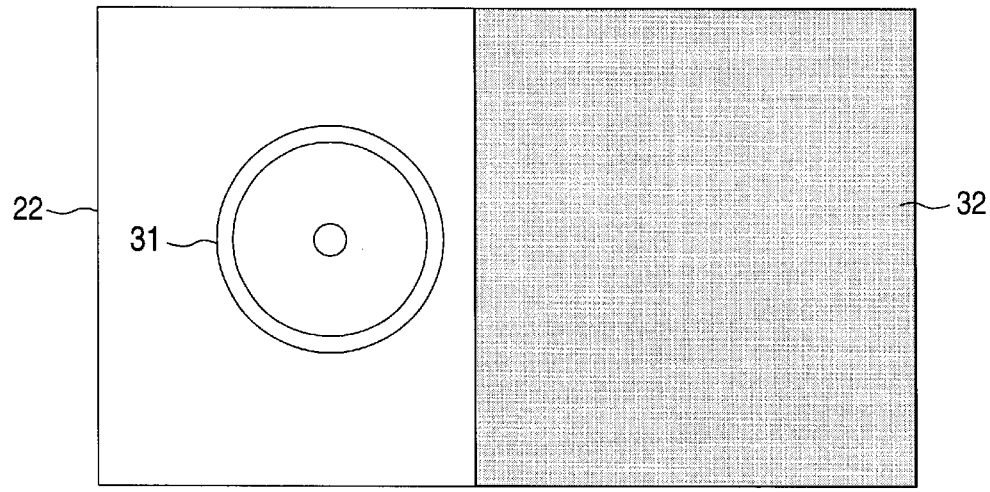

FIGS. 8A–8C illustrate a disk drive according to an embodiment of the present invention wherein the surface of the PCBA 28 opposite the electrical components 30 is attached to the HDA enclosure 22. The coating 32 is then applied over the electrical components 30 and the PCBA 28, including the crevices formed with respect to the HDA enclosure 22 near the edges of the PCBA 28.

Figure 9A:
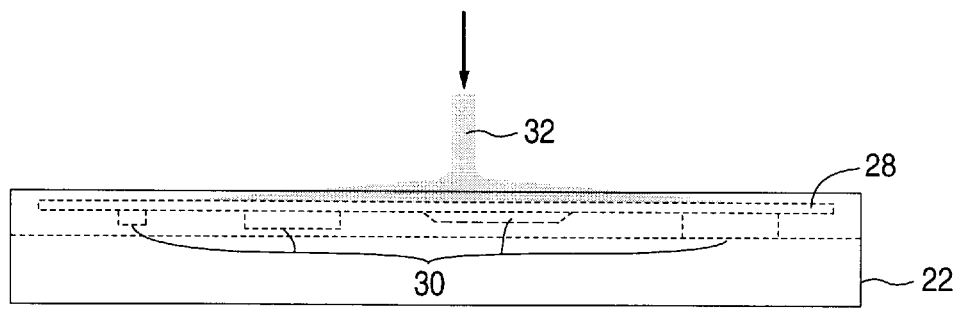
FIGS. 9A–9C illustrate an embodiment of the present invention wherein the coated PCBA extends substantially over the entire surface of the HDA enclosure.
Figure 9B:
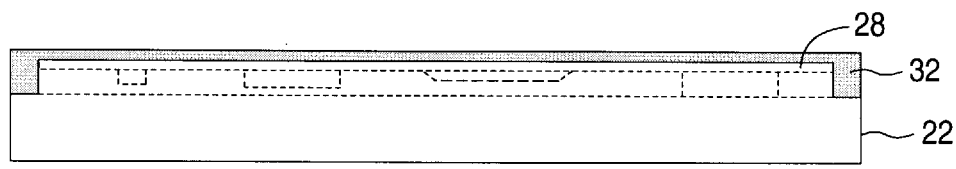
Figure 9C:
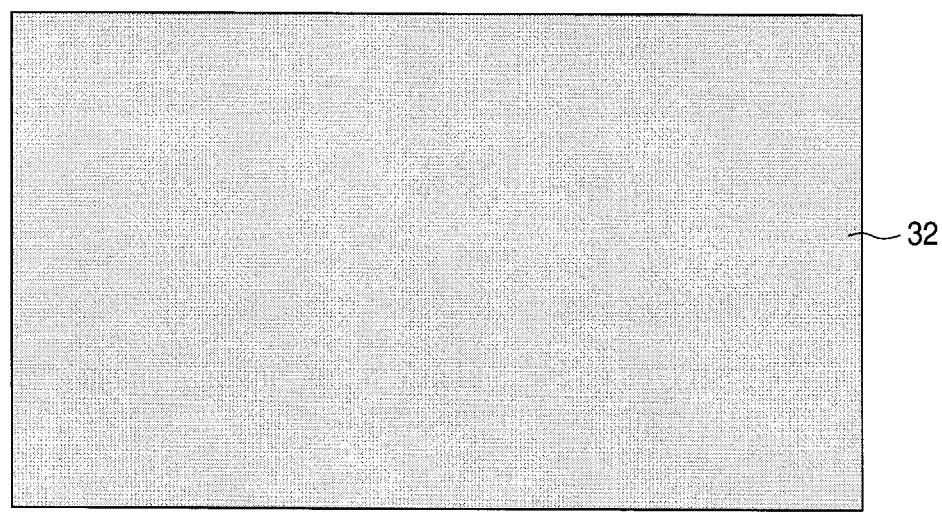

FIGS. 9A–9C illustrate a disk drive according to an embodiment of the present invention wherein the PCBA 28 substantially covers the entire bottom surface of the disk drive. FIG. 9C shows a bottom view of the disk drive wherein the coating 32 substantially covers the entire bottom surface, including the crevices formed with respect to the edges of the PCBA 28.

Figure 10A:
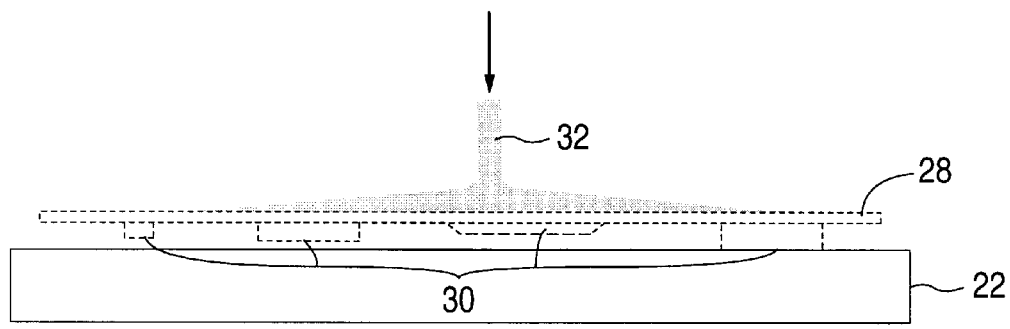
FIGS. 10A–10C illustrate an embodiment of the present invention wherein the coating covers at least part of the PCBA and the HDA enclosure, and in one embodiment, the coating substantially covers the entire PCBA and the entire HDA enclosure.
Figure 10B:
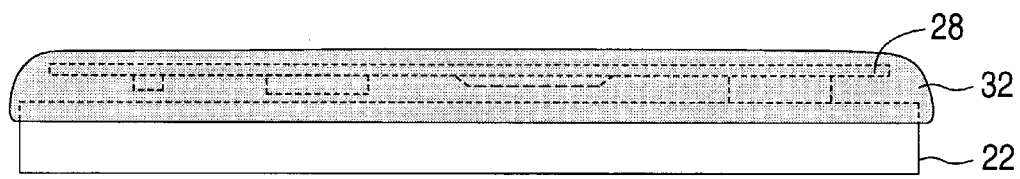
Figure 10C:
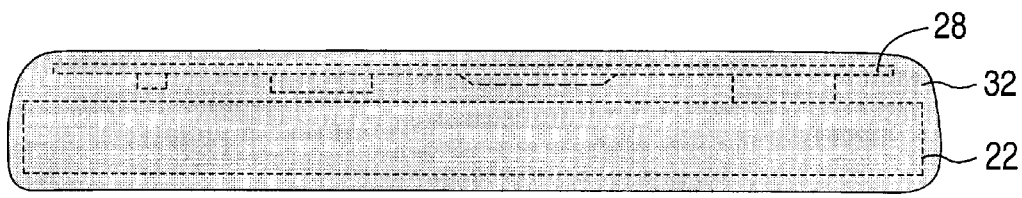

FIG. 10A illustrates a disk drive wherein the PCBA 28 is attached to a flat surface of the HDA enclosure 22 rather than inserted into a hollow area as in the above-described embodiments. The coating 32 is applied to the PCBA 28, and in the embodiment shown in FIG. 10B, flows over the PCBA 28 and onto the HDA enclosure 22. This embodiment strengthens the bonding of the coating 32 as well as buffers the otherwise sharp edges of the HDA enclosure 22 to further dampen the effects of a physical shock. In one embodiment, the coating 32 is used to attach the PCBA 28 to the HDA enclosure 22. In one embodiment, the coating 32 substantially covers the PCBA 28 and the HDA enclosure 22 as shown in FIG. 10C. In this embodiment, the entire disk drive may be dipped into a liquid form of the coating 32, or the coating may be applied to the disk drive after being placed in a mold (e.g., injection molded plastic).

In one embodiment, the coating 32 helps to attenuate acoustic noise emanating from the disk drive. In one embodiment, the coating 32 increases the rigidity of the disk drive which helps attenuate acoustic noise, and in another embodiment the volume and/or damping material of the coating 32 is selected to attenuate acoustic noise.

I claim:

1. A disk drive comprising:
   (a) a head disk assembly (HDA) comprising an enclosure for housing a disk and a head actuated radially over the disk;
   (b) a printed circuit board assembly (PCBA) comprising at least one attached electrical component; and
   (c) a non-electrically conductive coating bonded to at least part of the PCBA and at least part of the HDA enclosure, wherein:
      at least one crevice is formed between the PCBA and the HDA enclosure;
      the coating is disposed within at least part of the crevice; and
      the coating protects the disk drive against physical shocks.

2. The disk drive as recited in claim 1, wherein the coating is bonded to the PCBA by applying the coating in liquid form to the PCBA and solidifying the coating.

3. The disk drive as recited in claim 2, wherein the coating is liquefied through heating and solidified through cooling.

4. The disk drive as recited in claim 2, wherein the coating is solidified through a chemical process.

5. The disk drive as recited in claim 2, wherein the liquefied coating is sprayed onto the PCBA.

6. The disk drive as recited in claim 2, wherein the PCBA is dipped into the liquefied coating.

7. The disk drive as recited in claim 1, wherein the coating substantially covers the entire PCBA.

8. The disk drive as recited in claim 1, wherein the coating comprises a heat dissipating material.

9. The disk drive as recited in claim 1, wherein the coating comprises a plastic material.

10. The disk drive as recited in claim 1, wherein the coating comprises a polymer material.

11. The disk drive as recited in claim 1, wherein the coating covers a top surface of the electrical component.

12. The disk drive as recited in claim 1, wherein the coating covers at least part of the electrical component.

13. The disk drive as recited in claim 1, wherein the coating does not cover an area of the PCBA associated with the electrical component in order to facilitate heat dissipating from the electrical component.

14. The disk drive as recited in claim 1, wherein the electrical component is attached to a surface of the PCBA facing the HDA enclosure.

15. The disk drive as recited in claim 1, wherein the electrical component is attached to a surface of the PCBA facing away from the HDA enclosure.

16. The disk drive as recited in claim 1, wherein the coating substantially covers the entire PCBA and the entire HDA enclosure.

17. The disk drive as recited in claim 1, wherein the coating is bonded to the HDA enclosure and the PCBA by dipping the disk drive into a liquid form of the coating.

18. The disk drive as recited in claim 1, wherein the coating is bonded to the PCBA after the PCBA is attached to the HDA enclosure.

19. The disk drive as recited in claim 1, wherein the coating attaches the PCBA to the HDA enclosure.

20. A method of manufacturing a disk drive comprising the steps of:
   (a) inserting a disk and a head into an enclosure of a head disk assembly (HDA);
   (b) attaching at least one electrical component to a printed circuit board assembly (PCBA);
   (c) attaching the PCBA to the HDA enclosure; and
   (d) bonding a non-electrically conductive coating to at least part of the PCBA after attaching the electrical component to the PCBA, wherein the coating covers at least part of the HDA enclosure.

21. The method as recited in claim 20, wherein the coating substantially covers the entire PCBA.

22. The method as recited in claim 20, wherein the coating comprises a heat dissipating material.

23. The method as recited in claim 20, wherein the coating comprises a plastic material.

24. The method as recited in claim 20, wherein the coating comprises a polymer material.

25. The method as recited in claim 20, wherein the coating covers a top surface of the electrical component.

26. The method as recited in claim 20, wherein the coating covers at least part of the electrical component.

27. The method as recited in claim 20, wherein the coating does not cover an area of the PCBA associated with the electrical component in order to facilitate heat dissipating from the electrical component.

28. The method as recited in claim 20, wherein the electrical component is attached to a surface of the PCBA facing the HDA enclosure.

29. The method as recited in claim 20, wherein the electrical component is attached to a surface of the PCBA facing away from the HDA enclosure.

30. The method as recited in claim 20, wherein:
   (a) at least one crevice is formed between the PCBA and the HDA enclosure; and
   (b) the coating is disposed within at least part of the crevice.

31. The method as recited in claim 20, wherein the coating substantially covers the entire PCBA and the entire HDA enclosure.

32. The method as recited in claim 20, wherein the coating is bonded to the HDA enclosure and the PCBA by dipping the disk drive into a liquid form of the coating.

33. The method as recited in claim 20, wherein the coating attaches the PCBA to the HDA enclosure.

34. A method of manufacturing a disk drive comprising the steps of:
   (a) inserting a disk and a head into an enclosure of a head disk assembly (HDA);
   (b) attaching at least one electrical component to a printed circuit board assembly (PCBA);
   (c) attaching the PCBA to the HDA enclosure; and
   (d) bonding a non-electrically conductive coating to at least part of the PCBA and at least part of the HDA enclosure after attaching the PCBA to the HDA enclosure, wherein the coating protects the disk drive against physical shocks.

35. The method as recited in claim 34, wherein the coating is liquefied through heating and solidified through cooling.

36. The method as recited in claim 34, wherein the coating is solidified through a chemical process.

37. The method as recited in claim 34, wherein the liquefied coating is sprayed onto the PCBA.

38. The method as recited in claim 34, wherein the PCBA is dipped into the liquefied coating.

39. A disk drive comprising:
(a) a head disk assembly (HDA) comprising an enclosure for housing a disk and a head actuated radially over the disk;
(b) a printed circuit board assembly (PCBA) comprising a top surface and a bottom surface and at least one electrical component attached to the top surface, the PCBA attached to the HDA enclosure; and
(c) a non-electrically conductive coating bonded to at least part of the bottom surface of the PCBA, wherein the coating does not cover an area of the bottom surface associated with the electrical component in order to facilitate heat dissipating from the electrical component.

40. A method of manufacturing a disk drive comprising the steps of:
(a) inserting a disk and a head into an enclosure of a head disk assembly (HDA);
(b) attaching at least one electrical component to a top surface of a printed circuit board assembly (PCBA);
(c) attaching the PCBA to the HDA enclosure; and
(d) bonding a non-electrically conductive coating to at least part of a bottom surface of the PCBA after attaching the electrical component to the PCBA, wherein the coating does not cover an area of the bottom surface associated with the electrical component in order to facilitate heat dissipating from the electrical component.

41. A disk drive comprising:
(a) a head disk assembly (HDA) comprising an enclosure for housing a disk and a head actuated radially over the disk;
(b) a printed circuit board assembly (PCBA) comprising at least one attached electrical component; and
(c) a non-electrically conductive coating bonded to at least part of the PCBA and at least part of the HDA enclosure after attaching the PCBA to the HDA enclosure, wherein:

at least one crevice is formed between the PCBA and the HDA enclosure;
the coating is disposed within at least part of the crevice; and
the coating protects the disk drive against physical shocks.

42. The disk drive as recited in claim 41, wherein the coating is bonded to the PCBA by applying the coating in liquid form to the PCBA and solidifying the coating.

43. The disk drive as recited in claim 42, wherein the coating is liquefied through heating and solidified through cooling.

44. The disk drive as recited in claim 42, wherein the coating is solidified through a chemical process.

45. The disk drive as recited in claim 42, wherein the liquefied coating is sprayed onto the PCBA.

46. The disk drive as recited in claim 42, wherein the PCBA is dipped into the liquefied coating.

47. The disk drive as recited in claim 41, wherein the coating substantially covers the entire PCBA.

48. The disk drive as recited in claim 41, wherein the coating comprises a heat dissipating material.

49. The disk drive as recited in claim 41, wherein the coating comprises a plastic material.

50. The disk drive as recited in claim 41, wherein the coating comprises a polymer material.

51. The disk drive as recited in claim 41, wherein the electrical component is attached to a surface of the PCBA facing the HDA enclosure.

52. The disk drive as recited in claim 41, wherein the electrical component is attached to a surface of the PCBA facing away from the HDA enclosure.

53. The disk drive as recited in claim 41, wherein the coating substantially covers the entire PCBA and the entire HDA enclosure.

54. The disk drive as recited in claim 41, wherein the coating is bonded to the HDA enclosure and the PCBA by dipping the disk drive into a liquid form of the coating.

* * * * *